United States Patent [19]
Martignoni et al.

[11] Patent Number: 5,146,109
[45] Date of Patent: Sep. 8, 1992

[54] CIRCUIT FOR DRIVING A FLOATING CIRCUIT IN RESPONSE TO A DIGITAL SIGNAL

[75] Inventors: Fabrizio Martignoni, Morazzone; Claudio Diazzi, Milan; Albino Pidutti, Udine; Fabio Vio, Milan, all of Italy

[73] Assignee: SGS-Thomson Microelectronics S.r.l., Agrate Brianza, Italy

[21] Appl. No.: 736,003

[22] Filed: Jul. 25, 1991

[30] Foreign Application Priority Data

Jul. 27, 1990 [IT] Italy .................. 21087 A/90

[51] Int. Cl.$^5$ ............................................ H03K 3/037
[52] U.S. Cl. .................................. 307/270; 307/279; 307/451; 307/471; 307/585
[58] Field of Search ............... 307/270, 279, 471, 451, 307/585

[56] References Cited

U.S. PATENT DOCUMENTS

| | | | |
|---|---|---|---|
| 4,521,703 | 6/1985 | Dingwall | 307/279 |
| 4,532,436 | 6/1985 | Bismarck | 307/279 |
| 4,695,744 | 9/1987 | Giordano | 307/585 |
| 4,795,917 | 1/1989 | Scott et al. | 307/270 |
| 4,845,381 | 7/1989 | Cuevas | 307/279 |
| 4,973,864 | 11/1990 | Nogami | 307/279 |

Primary Examiner—Stanley D. Miller
Assistant Examiner—Scott A. Ouellette

[57] ABSTRACT

A driving circuit for driving a floating circuit (28) responsive to a digital signal (IN) includes two DMOS transistors (10, 12) which are driven in opposite phase on their respective gates starting from the digital signal. The two DMOS transistors are biased by a current source which is formed by a current mirror (16, 18), which mirrors a reference current ($I_{BIAS}$), and by an auxiliary circuit (34-44) for injecting an additional current pulse during switching. Two MOS transistors (20, 22) serve as the respective loads for the two DMOS transistors. The MOS transistors can be P-channel transistors, in which event the gate of each MOS transistor (20, 22) can be connected to the drain of the other MOS transistor. Two Zener diodes (24, 26) can be employed to limit the voltage between the gate and source of the respective MOS transistor. The driving output of the floating circuit (28) can be the drain of one of the DMOS transistors.

21 Claims, 1 Drawing Sheet

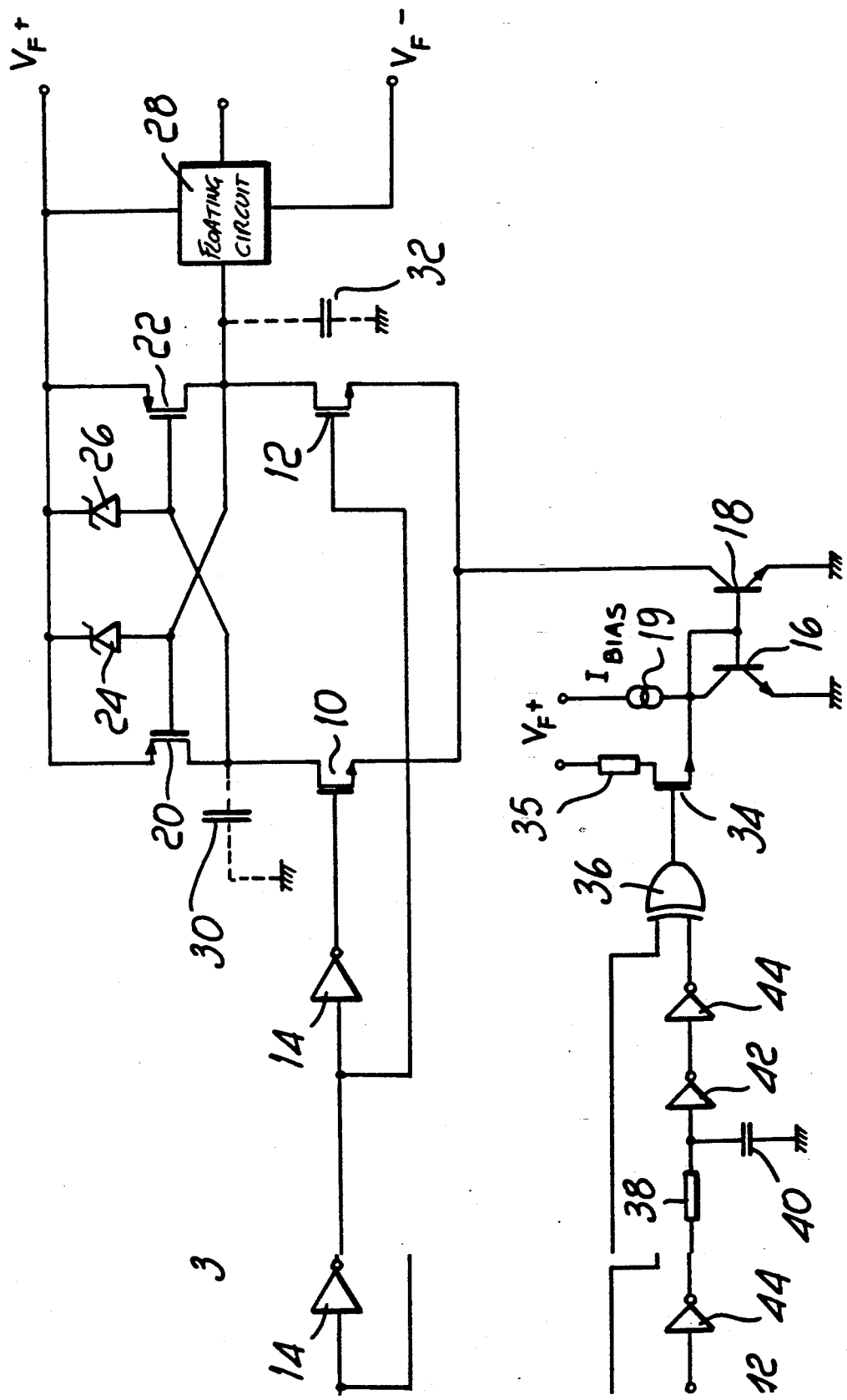

CIRCUIT FOR DRIVING A FLOATING CIRCUIT IN RESPONSE TO A DIGITAL SIGNAL

FIELD OF THE INVENTION

The present invention relates to a driving circuit for driving a floating circuit in response to a digital signal. In a particular aspect, the invention relates to such a driving circuit which is suitable for implementation in integrated circuit form with BCD technology.

BACKGROUND OF THE INVENTION

The devices used to drive a floating circuit with a digital or logic signal, also known as level shifters, must not lose the logic signal in the variations caused by the charging and discharging of the parasitic input capacitor of the floating circuit while the voltage thereof shifts with respect to the reference ground. In order that the input node of the floating circuit may assuredly follow the variations of the driving signal which drives the level shifter, the parasitic capacitor must in fact charge and discharge with the same speed as the driving logic signal, and for this purpose the input node of the floating circuit must be connected to a low-impedance point.

A simple way of solving the problem consists in causing a current to flow in a resistor which has one terminal at the high floating voltage and the opposite terminal connected to the input of the floating circuit. However, the resistor must have a small value, for example 1 kohm, and the voltage drop required across the resistor in order to produce a logic signal on the floating circuit requires a high current and thus a considerable power absorption.

In order to avoid these undesirable continuous consumptions, one solution consists in providing a flip-flop at the input of the floating circuit, with a double pulse drive in two high-value resistors for switching the flip-flop. In this case, current consumption in steady-state conditions is low, but in order to maintain a low impedance even during switching it is necessary to provide current sources for rapidly charging the parasitic capacitor. This entails a certain circuital complexity, besides the fact that in any case the presence of the flip-flop entails the risk of errors on the phases of the logic signal in case of outside noise during rise and fall.

SUMMARY OF THE INVENTION

An object of the invention is thus to provide a driving circuit for driving a floating circuit in response to a digital signal which is circuitally simple. Another object of the invention is to provide such a driving circuit which has a low power dissipation in the static phase. A further object of the invention is to provide a driving circuit for driving a floating circuit wherein the driving circuit has a low output impedance and a high output fluctuation rate.

The invention achieves these and other objects and advantages as will become apparent from the following description by means of a driving circuit for driving a floating circuit in response to a digital signal, comprising first, second, third, and fourth transistors; wherein said first and second transistors are DMOS (double diffusion metal oxide semiconductor) transistors, each having a source, a drain and a gate; wherein said third and fourth transistors are MOS transistors, each having a source, a drain and a gate; wherein the first and third transistors are connected in series between a current source and a voltage source; wherein the second and fourth transistors are connected in series between the current source and the voltage source; with the first and second transistors being driven in opposite phase on their respective gates starting from the digital signal; and wherein the gate of the third transistor is connected to the connection between the second and fourth transistors, and the gate of the fourth transistor is connected to the connection between the first and third transistors. The driving output of the driving circuit is the connection of the second transistor to the fourth transistor. One of the source and the drain of the first transistor can be connected to the current source, along with one of the source and the drain of the second transistor. One of the source and the drain of the third transistor can be connected to the voltage source, while one of the source and the drain of the fourth transistor can be connected to the voltage source.

In a presently preferred embodiment, the third and fourth transistors are P-channel transistors, the DMOS transistors are common-source connected with the sources of the two DMOS transistors being biased by the current source, and the drains of the DMOS transistors are connected to respective drains of respective P-channel transistors. Each high voltage source and its gate connected to the drain of the other P-channel transistor. Zener diodes can be employed to limit the voltage drop between the source and gate of each P-channel transistor. The current source can comprise the combination of a circuit for providing a reference current and a circuit for providing a short pulse in response to the leading portion of a digital signal pulse. The short pulse can be produced by an XOR (exclusive OR) circuit having the digital signal and a delayed version of the digital signal as inputs thereto.

BRIEF DESCRIPTION OF THE DRAWINGS

The sole FIGURE of the drawings is a schematic diagra of a driving circuit according to a preferred embodiment of the invention.

DETAILED DESCRIPTION

The invention is now described in greater detail with reference to a preferred embodiment, which is illustrated in the accompanying drawing, given by way of non-limitative example.

In the device illustrated in the FIGURE, two DMOS transistors 10, 12 are driven in opposite phase by a digital input signal from digital signal source IN by passing the digital input signal directly from source IN to the gate of DMOS transistor 12 and by passing the digital input signal through an inverter 14 to the gate of the DMOS transistor 10. The sources of the two DMOS transistors are connected to a current mirror which provides a biasing current. The current mirror comprises transistors 16, 18 having their gates connected to each other and to the drain of transistor 16. The sources of transistors 16 and 18 are connected to a reference voltage, e.g. ground. The drain of transistor 18 is connected to the source of each of DMOS transistors 10 and 12, while a reference current source 19 is connected between a high voltage source and the drain of transistor 16. Reference current source 19 provides a reference current $I_{BIAS}$.

The loads on the drains of the two DMOS transistors 10, 12 are constituted by P-channel transistors 20, 22, with the transistors 10 and 20 being connected in series with each other between the current source and a high voltage source $V_{F+}$ and the transistors 12 and 22 being similarly connected in series with each other between the current source and the high voltage source. The gate of transistor 20 is driven by the drain of transistor 22, and the gate of transistor 22 is driven by the drain of transistor 20. Zener diode 24 is connected between the gate and source of transistor 20, while Zener diode 26 is connected between the gate and source of transistor 22, to limit the voltage drop between the source and the gate of the respective P-channel transistor.

The drain of the DMOS transistor 12 is connected to the drive input of a per se known floating circuit 28 powered by the floating voltages $V_{F+}$, $V_{F-}$.

When the digital input signal from digital signal source IN is 0, the DMOS transistor 10 is "on" and the DMOS transistor 12 is "off". Consequently, the transistor 20 is "off" and the transistor 22 is "on" as well. When the digital input signal from source IN becomes high, the DMOS transistor 10 switches "off" and the DMOS transistor 12 switches "on", also causing the switching of the transistor 20 to "on" and the switching of the transistor 22 to "off". In static conditions, the conditions of the two transistors 20 and 22 are kept stable by the cross-connections between the gates and the drains of transistors 20 and 22, which make this portion of the circuit similar to a flip-flop.

The P-channel transistors 20, 22 are dimensioned so as to be able to rapidly charge the parasitic capacitors indicated by 30, 32, i.e. so as to have a low output resistance, for example approximately 1 kohm. The current flowing through the "on" DMOS transistor, which is normally equal to $I_{BIAS}$, can be relatively small, for example approximately 280 $\mu\bar{A}$.

During the switching operation, one of the DMOS transistors switches "off" while the other one switches "on", and in order to prevent the current, which is absorbed by the DMOS transistor which switches "on", from being insufficient to open the P-channel transistor connected thereto, the drive circuit further preferably comprises an auxiliary circuit for generating an additional short duration, high current pulse during the switching operation. The auxiliary circuit comprises a transistor 34 which is source-follower connected to the collector of transistor 16. A resistor 35 is connected between the drain of transistor 34 and voltage source VF+. The transistor 34 is driven by an XOR circuit 36, which receives the digital signal from digital signal source IN on one of its inputs and receives the same signal, delayed by a delay chain on its other input. The delay chain can be formed by a series resistor 38, a parallel capacitor 40 and two cascade inverters 42, 44 connected between the source IN and the other input of the XOR. It can thus be seen that the source follower 34 is driven by a short pulse from the XOR which appears during the period between the arrival at one input of XOR 36 of the leading edge of the digital pulse from digital signal source IN and the arrival at the other input of XOR 36 of the delayed version of the leading edge of the digital pulse. The characteristics of the delay chain can be selected to provide a pulse at the output of XOR 36 which is shorter in duration than the digital input pulse from digital signal source IN. Thus, this auxiliary circuit injects a current pulse in parallel to the reference $I_{BIAS}$. The added pulse from the auxiliary circuit can have a high value, for example 10 m$\bar{A}$, without significantly affecting the average absorption of the driving circuit as a whole.

A preferred embodiment of the invention has been described, but it is understood that other modifications and variations, which are within the scope of the inventive concept, can be employed. For example, an equivalent circuit utilizing N-channel transistors as the loads for the DMOS transistors instead of the illustrated P-channel transistors could be employed. Other forms of circuits for producing a reference current and/or an auxiliary pulse current can be utilized. The inverted digital signal can be applied to the gate of DMOS transistor 12 instead of DMOS transistor 10.

We claim:

1. A driving circuit for driving a floating circuit in response to a digital signal, comprising a digital signal source which produces said digital signal; first, second, third and fourth transistors; a current source; and a voltage source; each of said first and second transistors being a MOS transistor having a source, a drain and a gate; each of said third and fourth transistors being a MOS transistor having a source, a drain and a gate; said first and third transistors being connected in series between said current source and said voltage source; said second and fourth transistors being connected in series between said current source and said voltage source; said first and second transistors being driven in opposite phase on their respective gates starting from said digital signal; the gate of said third transistor being connected to the connection of said fourth transistor to said second transistor; the gate of said fourth transistor being connected to the connection of said third transistor to said first transistor; an auxiliary circuit connected to receive said digital signal and connected to said current source to produce an increased current flow through said current source for a limited time immediately following a transition of said digital signal; and a driving output of said driving circuit being the connection of said second transistor to said fourth transistor.

2. A driving circuit in accordance with claim 1 wherein one of the source and the drain of the first transistor is connected to said current source, one of the source and the drain of the second transistor is connected to said current source, one of the source and the drain of the third transistor is connected to said voltage source, and one of the source and the drain of the fourth transistor is connected to said voltage source.

3. A driving circuit in accordance with claim 1 wherein the source of said first transistor is connected to the source of said second transistor, with the sources of the first and second transistors being biased by said current source; the drain of said first transistor is connected to the drain of said third transistor; the drain of said second transistor is connected to the drain of said fourth transistor; the source of said third transistor and the source of said fourth transistor are connected to said voltage source; the gate of said third transistor is connected to the drain of said fourth transistor; and the gate of said fourth transistor is connected to the drain of said third transistor.

4. A driving circuit according to claim 3, wherein said third and fourth transistors are P-channel transistors.

5. A driving circuit according to claim 1, wherein said third and fourth transistors are P-channel transistors.

6. A driving circuit according to claim 1, further comprising a first Zener diode connected between the gate of said third transistor and said voltage source, and a second Zener diode connected between the gate of said fourth transistor and said voltage source.

7. A driving circuit according to claim 1, wherein said current source comprises a reference source which produces a reference current, and a current mirror which mirrors said reference current from said reference source.

8. An integrated circuit comprising a floating circuit connected between a high voltage source and a low voltage source and having a drive input, and a driving circuit according to claim 1, wherein a driving output of said driving circuit is connected to the drive input of said floating circuit.

9. A driving circuit for driving a floating circuit in response to a digital signal, comprising a digital signal source which produces said digital signal; first, second, third and fourth transistors; a current source; and a voltage source; each of said first and second transistors being a MOS transistor having a source, a drain and a gate; each of said third and fourth transistors being a MOS transistor having a source, a drain and a gate; said first and third transistors being connected in series between said current source and said voltage source; said second and fourth transistors being connected in series between said current source and said voltage source; said first and second transistors being driven in opposite phase on their respective gates starting from said digital signal; the gate of said third transistor being connected to the connection of said fourth transistor to said second transistor; the gate of said fourth transistor being connected to the connection of said third transistor to said first transistor; and a driving output of said driving circuit being the connection of said second transistor to said fourth transistor, wherein the source of said first transistor is connected to the source of said second transistor, with the sources of the first and second transistors being biased by said current source; the drain of said first transistor is connected to the drain of said third transistor; the drian of said second transistor is connected to the drain of said fourth transistor; the source of said third transistor and the source of said fourth transistor are connected to said voltage source; the gate of said third transistor is connected to the drain of said fourth transistor; and the gate of said fourth transistor is connected to the drain of said third transistor, whereins aid third and fourth transistors are P-channel transistors, and further including a first Zener diode connected between the gate of said third transistor and said voltage soruce, and a second Zener diode connected between the gate of said fourth transistor and said voltage source.

10. A driving circuit according to claim 9, wherein said current source comprises a reference source which produces a reference current, and a current mirror which mirrors said reference current from said reference source.

11. A driving circuit according to claim 10, wherein said digital signal comprises at least oen pulse signal, and wherein said current source further comprises an auxiliary circuit for injecting a high current pulse into said current mirror in response to the leading portion of said pulse signal.

12. A driving circuit according to claim 11, wherein said high current pulse is of shorter duration than said pulse signal.

13. A driving circuit according to claim 12, wherein said auxiliary circuit comprises a pulse source and a fifth transistor; said pulse source being driven by said digital signal; said fifth transistor being source-follower connected in parallel to said reference source.

14. A driving circuit according to claim 13, wherein said pulse source comprises a delay circuit, an XOR circuit having first and second inputs and an output, with the first input of said XOR being connected to said digital signal source, the second input of said XOR being connected through said delay circuit to said digital signal source, and the output of said XOR circuit being connected to the gate of said fifth transistor.

15. A driving circuit according to claim 14, wherein the gate of one of said first and second transistors is connected directly to said digital signal source and the gate of the other of said first and second transistors is connected to said digital signal source through an inverter.

16. A driving circuit for driving a floating circuit in response to a digital signal, comprising a digital signal source which produces said digital signal; first, second, third and fourth transistors; a current source; and a voltage source; each of said first and second transistors being a MOS transistor having a source, a drain and a gate; each of said third and fourth transistors being a MOS transistor having a source, a drain and a gate; said first and third transistors being connected in series between said current source and said voltage source; said second and fourth transistors being connected in series between said current source and said voltage source; said first and second transistors being driven in opposite phase on their respective gates starting from said digital signal; the gate of said third transistor being connected to the connection of said fourth transistor to said second transistor; the gate of said fourth transistor being connected to the connection of said third transistor to said first transistor; and a driving output of said driving circuit being the connection of said second transistor to said fourth transistor, wherein the gate of one of said first and second transistor is connected directly to said digital signal source and the gate of the other of said first and second transistors is connected to said digital signal source through an inverter.

17. A driving circuit for driving a floating circuit in response to a digital signal, comprising a digital signal source which produces said digital signal; first, second, third and fourth transistors; a current source; and a voltage source; each of said first and second transistors being a MOS transistor having a source, a drain and a gate; each of said third and fourth transistors being a MOS transistor having a source, a drain and a gate; said first and third transistors being connected in series between said current source and said voltage source; said second and fourth transistors being connected in series between said current source and said voltage source; said first and second transistors being driven in opposite phase on their respective gates starting from said digital signal; the gate of said third transistor being connected to the connection of said fourth transistor to said second transistor; the gate of said fourth transistor being connected to the connection of said third transistor to said first transistor; and a driving output of said driving circuit being the connection of said second transistor to said fourth transistor, wherein said current source comprises a reference source which produces a reference current and a current mirror which mirrors said reference current from said reference source, wherein said digital signal comprises at least one pulse signal, and whereins aid current source further comprises an auxiliary circuit for injecting a high current pulse into said current mirror in response to the leading portion of said pulse signal.

18. A driving circuit according to claim 17, wherien said high current pulse is of shorter duration than said pulse signal.

19. A driving circuit according to claim 17, wherein said auxiliary circuit comprises a pulse source and a fifth transistor; said pulse source being driven by said digital signal; said fifth transistor being source-follower connected in parallel to said reference source.

20. A driving circuit according to claim 19, wherein said pulse source comprises a delay circuit, an XOR circuit having first and second inputs and an output, with the first input of said XOR being connected to said digital signal source, the second input of said XOR being connected through said delay circuit to said digital signal source, and the output of said XOR circuit being connected to a gate of said fifth transistor.

21. A method for driving a floating circuit in response to a digital signal, comprising the steps of:

driving a first MOS transistor, which has a gate, drain and source, with said digital signal connected to the gate of said first transistor, driving a second MOS transistor, which has a gate, drain and source, with an inverted signal of said digital signal connected to the gate of said second transistor, wherein said floating circuit is connected to the drain of said first or second transistor, driving a third MOS transistor, which has a gate, drain and source, with a signal generated at the drain of said second transistor and connected to the gate of said third transistor, driving a fourth MOS transistor, which has a gate, drain and source, with a signal generated at the drain of said first transistor and connected to the gate of said fourth transistor, and driving a current source, which is connected in series with said first and third transistors between first and second voltage reference terminals and which is also connected in series with said second and fourth transistors between said first and second voltage reference termainals, to produce a pulse current through said current source for a limited time immediately following a transition of said digital signal followed by a lesser bias current through said current source until a next transition of said digital signal.

* * * * *